United States Patent
Pellonperä

(10) Patent No.: US 6,690,743 B1
(45) Date of Patent: Feb. 10, 2004

(54) COMPENSATION OF DELAY IN LINEARIZATION LOOP OF POWER AMPLIFIER

(75) Inventor: Marko Pellonperä, Tampere (FI)

(73) Assignee: Nokia Telecommunications Oy, Espoo (FI)

( * ) Notice: Subject to any disclaimer, the term of this patent is extended or adjusted under 35 U.S.C. 154(b) by 0 days.

(21) Appl. No.: 09/319,463

(22) PCT Filed: Oct. 7, 1998

(86) PCT No.: PCT/FI98/00786

§ 371 (c)(1),
(2), (4) Date: Jul. 29, 1999

(87) PCT Pub. No.: WO99/19990

PCT Pub. Date: Apr. 22, 1999

(30) Foreign Application Priority Data

Oct. 9, 1997 (FI) ................................................ 973918

(51) Int. Cl.[7] .............................. H04B 1/40; H04B 1/04
(52) U.S. Cl. ........................ 375/296; 375/219; 375/297; 375/298
(58) Field of Search ................................. 375/296, 297, 375/298, 219

(56) References Cited

U.S. PATENT DOCUMENTS

| | | | | |
|---|---|---|---|---|
| 3,361,984 A | * | 1/1968 | Barditch et al. | ............ 327/574 |
| 4,538,180 A | * | 8/1985 | Cluniat | ........................ 348/724 |
| 5,396,196 A | | 3/1995 | Blodgett | |
| 5,420,536 A | | 5/1995 | Faulkner et al. | |
| 5,469,114 A | | 11/1995 | Saxena | |

FOREIGN PATENT DOCUMENTS

| | | | | |
|---|---|---|---|---|
| JP | 98204774 A | * | 8/1996 | ............. H03F/1/34 |
| WO | 97/15980 | | 5/1997 | |

OTHER PUBLICATIONS

Patent Abstracts of Japan, abstract of JP 8–78967 A (NEC Corp), Mar. 22, 1996.

* cited by examiner

*Primary Examiner*—Stephen Chin
*Assistant Examiner*—Guillermo Muñoz
(74) *Attorney, Agent, or Firm*—Pillsbury Winthrop LLP

(57) ABSTRACT

A method of compensating delay in an linearization loop of a power amplifier and a linearization arrangement of a power amplifier, which arrangement includes an I/Q modulator, one or more power amplifiers to be linearized and generating delay, and a feedback loop including an I/Q demodulator when the I/Q modulator and the I/Q demodulator derive an oscillator frequency from the same local oscillator. In accordance with the invention, the delay generated the power amplifier in the feedback is compensated by delaying a local oscillator signal applied to the I/Q demodulator. The delay of the local oscillator signal applied to the I/Q demodulator is generated by an amplifier optimized to have a great delay, preferably by a small-signal amplifier.

5 Claims, 1 Drawing Sheet

COMPENSATION OF DELAY IN LINEARIZATION LOOP OF POWER AMPLIFIER

This application is the national phase of international application PCT/F198/00786 filed Oct. 7, 1998 which designated the U.S.

BACKGROUND OF THE INVENTION

The present invention relates to a method of compensating delay in a linearization loop of a power amplifier, which loop comprises an I/Q modulator, one or more power amplifiers to be linearized and generating delay, and a feedback loop comprising an I/Q demodulator when the I/Q modulator and the I/Q demodulator derive an oscillation frequency from the same local oscillator.

Linearized amplifiers are needed in current digital wireless communications systems, for example, since it is required that the spectrum of a signal to be transmitted must not spread broader than the actual useful band. The spreading of a spectrum is caused by the nonlinearity of amplifiers and it generates interference to neighboring channels, for example. The linearity of amplifier stages depends on how they are biased and they can be classified according to linearity: a class A amplifier is the most linear but it has poor efficiency, while a class C amplifier, for example, has good efficiency but it is also highly nonlinear. Good efficiency is an important property in power amplifiers, and this is particularly emphasized in wireless communications devices whose battery capacity is limited. Hence, amplifiers that have good efficiency but are nonlinear and must be linearized are used.

A known method of linearizing a nonlinear radio-frequency power amplifier is cartesian feedback. In outline, its operational principle is as follows: the data to be transmitted is included in the baseband signals I and Q. These signals are conveyed to an I/Q modulator in which the signals are combined and modulated directly to a final frequency. A final-frequency signal is amplified by one or more nonlinear radio-frequency power amplifiers and conveyed to an antenna. The radio-frequency, amplified signal is sampled after the last amplifier stage by a directional coupler, for example. The sample signal is conveyed to an I/Q demodulator in which it is demodulated to baseband and the I and Q signals are separated from it. The baseband I and Q sample signals are finally summed to the actual I and Q signals. The summing generates predistortion of the I and Q signals, on account of which predistortion the nonlinearity generated in the power amplifiers is at least partly cancelled.

A problem in the arrangement described above is that the I/Q modulator and the I/Q demodulator both receive a local oscillator signal from the same source. On the other hand, the power amplifiers generate delay and the sampled I and Q signals return in a wrong phase. This distortion can be compensated by adjusting the phase of the local oscillator signal applied to the I/Q demodulator to correspond the phase of the I and Q sample signals. In the known solutions this phase adjustment is implemented by transformers, by special phase inversing circuits or a digital phase adjuster. The known solutions are similar in being space-taking and relatively expensive. Furthermore, the solutions are often complex and may require much manual work in production. Such solutions are thus rather poorly suited to small mobile communications devices produced in great numbers.

BRIEF DESCRIPTION OF THE INVENTION

An object of the invention is thus to provide a method and an apparatus implementing the method so as to solve the above-mentioned problems. The objects of the invention can be achieved by a method of compensating delay in a linearization loop of a power amplifier, which loop comprises an I/Q modulator, one or more power amplifiers to be linearized and generating delay, and a feedback loop comprising an I/Q demodulator when the I/Q modulator and the I/Q demodulator derive an oscillation frequency from the same local oscillator, whereby the delay generated by the power amplifiers in the feedback is compensated by delaying a local oscillator signal applied to the I/Q demodulator, whereby the method is characterized in that the delay of the local oscillator signal applied to the I/Q demodulator is generated by an amplifier optimized to have a great delay, preferably by a small-signal amplifier.

The invention is based on the idea that delay is compensated by delay, not by phase adjustment. In other words, an arrangement which causes phase shift is replaced by an arrangement which generates delay in the signal branch applied to the I/Q demodulator of a local oscillator. An advantage of the solution is that the arrangement is fairly simple. In accordance with the invention, the delay of a local oscillator signal applied to the I/Q demodulator is generated by an amplifier optimized to have a great delay, preferably by a small-signal amplifier. The group delay, i.e. the delay, of the amplifier is preferably 5 to 10 ns or more. Since the local oscillator signal must usually be amplified before the I/Q demodulator in any case, the method of the invention can easily be used by optimizing an existing signal amplifier to have a delay. The advantage is that no additional phase adjustment circuits are needed.

The invention further relates to a linearization arrangement of a power amplifier, which arrangement comprises an I/Q modulator in which the baseband signals I and Q containing data are combined and modulated to a final frequency, one or more power amplifiers to be linearized and generating delay, by which power amplifiers a final-frequency signal is amplified and which signal is conveyed to an antenna to be transmitted after the amplification, and a sampling arrangement by which the amplified, final-frequency signal is sampled before the antenna, and an I/Q demodulator to which said signal sample is applied and in which the signal sample is demodulated to base-band and I and Q sample signals are separated from it, and a feedback in which the I and Q sample signals demodulated and separated from the signal sample are summed to the actual I and Q signals, and a local oscillator from which a local oscillator signal is conveyed to the I/Q modulator and the I/Q demodulator, whereby an arrangement is provided between the local oscillator and the I/Q demodulator, by which arrangement the local oscillator signal applied to the I/Q demodulator is delayed in order to compensate the delay generated in the power amplifiers, whereby the linearization arrangement is characterized in that the arrangement for delaying the local oscillator signal applied to the I/Q demodulator is an amplifier which is optimized to produce a desired delay to a desired frequency range, and that the amplifier is preferably a small-signal amplifier. In accordance with the invention, the arrangement for delaying the local oscillator signal applied to the I/Q demodulator is an amplifier which is optimized to produce a desired delay to a desired frequency range, and which amplifier is preferably a small-signal amplifier. By means of such an arrangement, the advantages provided by the method of the invention can be achieved by a simple structure which requires no more than few additional components and which is relatively inexpensive.

BRIEF DESCRIPTION OF THE DRAWINGS

The invention is now described in closer detail in connection with the preferred embodiments with reference to the accompanying drawings, in which.

DETAILED DESCRIPTION OF THE INVENTION

Figure 1:
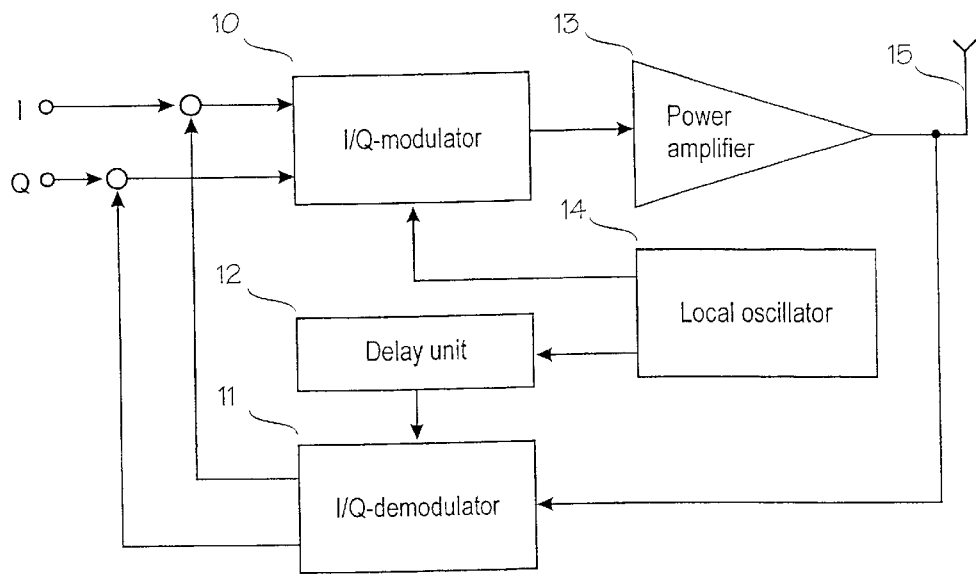
FIG. 1 shows a block diagram of a linearization arrangement of a power amplifier in accordance with the invention.

A linearization arrangement of a power amplifier in accordance with FIG. 1 comprises, in outline, an I/Q modulator 10, an I/Q demodulator 11, at least one power amplifier 13 to be linearized, a local oscillator 14, a delay unit 12 and an antenna 15. The I/Q modulator 10 and the I/Q demodulator 11 operate on a quadrature modulation principle. It enables two independent signals to be combined in a transmitter and to be transmitted on the same transmission band and to be separated again from each other in a receiver. The principle of the quadrature modulation is that two separate signals I and Q (Inphase and Quadrature phase) are modulated by using the same carrier frequency, but the phases of the carrier waves deviate from each other in such a manner that the carrier wave of signal Q is 90° behind the carrier wave of signal I. The signals are summed after the modulation. Signals I and Q can be separated from each other on account of the phase difference when a sum signal is demodulated. To ensure the functionality of the method, the local oscillator signals used by the modulator and demodulator, on the basis of which signals the carrier wave is formed, must be mutually of the same frequency and in a correct phase.

The baseband I and Q signals containing data are conveyed to the I/Q modulator 10 in which they are combined and modulated to a final frequency (transmission frequency). A final-frequency signal is further conveyed to the nonlinear power amplifier 13 in which the signal is amplified. There can be several power amplifier units 13 coupled in series. After the amplification, the signal is conveyed to the antenna 15 to be transmitted.

The amplified, final-frequency signal is sampled after an amplifier stage the power amplifier 13 and conveyed to the I/Q demodulator 11 in which the sample signal is demodulated to baseband and I and Q sample signals are separated from it. The baseband I and Q sample signals obtained are summed to the actual I and Q signals. The summing of the sample signals to the actual signals predistorts the signals applied to the I/Q modulator 10 and further to the power amplifier 13 in such a manner that the nonlinearity caused by the power amplifier 13 is cancelled to be as low as possible.

The local oscillator unit 14 produces an oscillator signal which is conveyed to the I/Q modulator 10 and, via the delay unit 12, to the I/Q demodulator 11. The local oscillator signal applied to the I/Q demodulator 11 is delayed in the delay unit 12 since the sample signal applied to the I/Q demodulator 11 and modulated in the I/Q modulator 10, synchronized by the local oscillator 14, is delayed in the power amplifier 13. To ensure a correct manner of demodulation of the sample signal, the local oscillator signal applied to the I/Q demodulator and the sample signal must be in a correct phase with respect to each other. The delay generated to the signal in the power amplifier is thus compensated by the delay unit 12.

Figure 2:
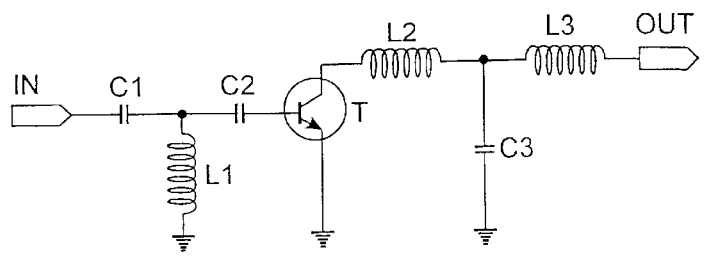
FIG. 2 shows a circuit diagram of a transistor amplifier stage optimized to have a delay and in accordance with the invention.

FIG. 2 shows a circuit diagram of a small-signal amplifier optimized to have a delay and in accordance with the invention, the circuit diagram comprising, for the sake of clarity, only the most relevant components to the invention.

Generating delay in the amplifier is based on the known fact that delay is the derivative of phase as a function of angular frequency. In other words, a drastic change of phase in a particular frequency range also results in a great delay in the range. In the simulations and practical tests performed by the applicant, it has been detected that drastic changes of phase to a desired frequency range can best be implemented by an amplifier whose input is matched to be of a high-pass type and the output is matched to be of a low-pass type.

The operation of the arrangement of FIG. 2 is, in outline, as follows: a signal is inputted via an IN port. The input is arranged to be of a high-pass type by means of a matching circuit formed by capacitors C1 and C2 and a coil L1. The signal passed through the matching circuit controls a transistor T. The transistor T amplifies the signal and the amplified signal proceeds through the matching circuit of the output. The output is arranged to be of a low-pass type by means a matching circuit formed by coils L2 and L3 and a capacitor C3. The signal passed through the matching circuit of the output is outputted via an OUT port.

Figure 3:
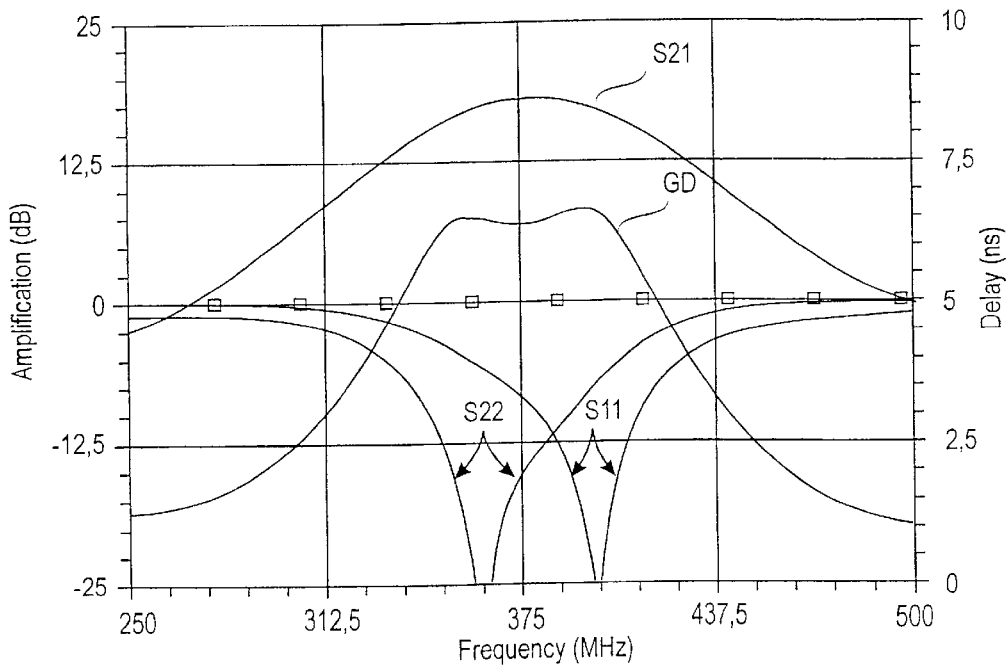
FIG. 3 shows the input and output matchings, i.e. reflection losses, group delay, i.e. delay, and amplification as a function of frequency of an amplifier stage of a band-pass type.

The matching circuits of the input and the output are further mutually arranged so as to yield an amplifier of a band-pass type. The changes caused by the amplifier in the phase of the signal, and thus also the delay, are the greater the narrower the band confined by the matchings of the input and the output. If the input and output matchings are arranged to the same frequency, a peak-like delay results which is extremely great but active in a narrow frequency area. This is not purposeful, however, and a more preferable result is achieved when the input matching is provided in the upper edge of a desired frequency band to be delayed, and the output matching is provided in the lower edge of the frequency band. The result is then a steadier delay which is active in a more extensive frequency range. FIG. 3 illustrates a frequency response S21 and delay GD of such an amplifier as a function of frequency. S11 describes the matching, i.e. return loss, of an input of a high-pass type. The matching of the input is arranged slightly above the average frequency about 380 MHz. Correspondingly, S22 describes the matching, i.e. return loss, of an output of a low-pass type. The matching of the output is arranged slightly below the average frequency about 380 MHz. A band in which the group delay, i.e. the delay GD, of the amplifier is relatively steady is formed between the matchings of the input and the output. The nearer to the average frequency and each other the matchings of the input and the output are arranged, the higher and sharper the delay curve GD is. The arrangement can also be implemented to be adjustable by using adjustable components, by replacing a capacitor C3 by an appropriate capacitance diode, for example.

If an amplifier of a local oscillator signal is used between the local oscillator 14 and the I/Q demodulator 11, an arrangement in accordance with FIG. 2 and generating delay is relatively simple and inexpensive to add to such an existing amplifier. The arrangement can be implemented in many different ways by using separate components or by integrating the delay arrangement into an IC circuit, for example, without deviating from the basic idea of the invention.

It is obvious to those skilled in the art that the basic idea of the invention can be implemented in various ways with progress in technology. The invention and its embodiments are thus not restricted to the examples described above but they can vary within the scope of the claims.

What is claimed is:

1. A linearization arrangement of a power amplifier, which arrangement comprises an I/Q modulator in which the baseband signals I and Q containing data are combined and modulated to a final frequency, one or more power amplifiers to be linearized and generating delay, by which power amplifiers the final frequency signal is amplified and which signal is conveyed to an antenna to be transmitted after the amplification, and a sampling arrangement by which the amplified, final frequency signal is sampled before the antenna, and an I/Q demodulator to which said signal sample is applied and in which the signal sample is demodulated to baseband and I and Q sample signals are separated from it, and a feedback in which the I and Q sample signals demodulated and separated from the signal sample are summed to the actual I and Q signals, and a local oscillator from which a local oscillator signal is conveyed to the I/Q modulator and the I/Q demodulator, whereby an arrangement is provided between the local oscillator and the I/Q demodulator, by which arrangement the local oscillator signal applied to the I/Q demodulator is delayed in order to compensate the delay generated in the power amplifiers, wherein:

the arrangement for delaying the local oscillator signal applied to the I/Q demodulator is an amplifier which is optimized to produce a desired delay to a desired frequency range;

the delay generated in the amplifier delaying the local oscillator signal applied to the I/Q demodulator is generated by arranging the amplifier to be band-passing at the frequency of the local oscillator signal; and the matching of the input of the amplifier delaying the local oscillator signal applied to the I/Q demodulator is high-passing and the matching of the output is low-passing.

2. A linearization arrangement as claimed in claim 1, wherein the high-passing matching of the input of the amplifier is arranged off the average frequency of the amplifier in the upper edge of the pass band, and the low-passing matching of the output is arranged in the lower edge of the pass band in such a manner that the amplifier has a relatively steady delay in the pass band.

3. A linearization arrangement as claimed in claim 1, wherein one or more of the components forming the amplifier delaying the local oscillator signal applied to the I/Q demodulator are adjustable, whereby the delay generated by the amplifier and the bandwidth can be adjusted.

4. A linearization arrangement as claimed in claim 1, wherein the amplifier is arranged to produce a delay ranging from 5 to 10 ns.

5. A linearization arrangement as claimed in claim 1, wherein the amplifier producing the delay is a small signal amplifier.

* * * * *